US007572128B2

(12) United States Patent
Revelle, II

(10) Patent No.: US 7,572,128 B2
(45) Date of Patent: Aug. 11, 2009

(54) SYSTEMS FOR WIRELESS ANTENNA CONNECTION

(75) Inventor: Charles Riddick Revelle, II, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 12/013,823

(22) Filed: Jan. 14, 2008

(65) Prior Publication Data

US 2009/0181570 A1 Jul. 16, 2009

(51) Int. Cl.
*H01R 12/00* (2006.01)
*H05K 1/00* (2006.01)

(52) U.S. Cl. ......................... 439/63; 439/916; 439/930; 439/404

(58) Field of Classification Search .................. 439/63, 439/581, 916, 930, 71, 404; 343/906
See application file for complete search history.

(56) References Cited

U.S. PATENT DOCUMENTS 6,007,347 A 12/1999 Keldsen et al. ................ 439/63
6,386,913 B1 5/2002 Mohammad et al. ........ 439/579
6,531,985 B1 3/2003 Jones et al. ................. 343/702
7,107,034 B2 9/2006 Davis ......................... 455/296
7,114,859 B1 10/2006 Tuohimaa et al. ............. 385/89
7,322,833 B1 * 1/2008 Hakansson et al. ............ 439/67
7,338,316 B2 * 3/2008 Blickle ....................... 439/546

* cited by examiner

*Primary Examiner*—Javaid Nasri
(74) *Attorney, Agent, or Firm*—Baker Botts L.L.P.

(57) ABSTRACT

A system for connecting a plurality of antenna cables to a wireless card includes a header connector and a connector plug. The header connector includes a header connector housing and multiple terminal pairs positioned in the header connector housing, each terminal pair including a first terminal and a second terminal. Each terminal includes a connection surface for securing the terminal to a substrate. The connector plug houses and positions multiple antenna cable end portions, each including an inner conductor and an outer conductor. The connector plug is configured to be mated with the header connector such that each cable end portion mates with one of the terminal pairs of the header connector, the inner conductor of the cable end portion mating with the first terminal of the terminal pair, and the outer conductor of the cable end portion mating with the second terminal of the terminal pair.

17 Claims, 5 Drawing Sheets

SYSTEMS FOR WIRELESS ANTENNA CONNECTION

TECHNICAL FIELD

The present disclosure relates in general to information handling systems, and more particularly to a systems for connecting wireless antennas to wireless cards.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Many information handling systems include devices for wireless communications. For example, laptop or other portable devices often include one or more wireless cards attached to one or more antennas. Wireless cards may provide for wireless communications via any number of different wireless communication protocols, e.g., wireless LAN (WLAN), wireless WAN (WWAN), Bluetooth, Ultra WideBand, etc. Recently, combo cards have been developed that embed multiple wireless standards on a single substrate (e.g., a printed circuit board).

Emerging mobile communication standards WLAN and WWAN products require greater use of primary and auxiliary antennas in support of increases in bandwidth and data rates. The legacy and current IEEE standards for WLAN required only a primary and auxiliary antenna. The emerging WLAN and WWAN standards such as WLAN IEEE 802.11n and WWAN EDGE and 4G radios now require a primary antenna, secondary antenna, and auxiliary antenna for higher bandwidth transmissions.

As a result of these emerging wireless standards and the growth of wireless combo cards, many developing products require three, four, five, or more antenna connections.

Wireless antenna cables in such technologies are typically configured as coaxial cables. Such antenna cables are typically connected to wireless cards using individual press-fit micro connectors. FIG. 1 illustrates a system for connecting a wireless antenna apparatus 10 to a wireless card 12 using existing techniques. Antenna apparatus 10 includes a pair of transmitting/receiving surfaces 14*a* and 14*b* and a pair of coaxial wires 16*a* and 16*b* leading from surfaces 14*a* and 14*b*, each coaxial wire terminating in a connector 20. Wireless card 12 includes various electronic components 22 (e.g., silicon chips, transistors, resistors, etc.) and a pair of connectors

24. Other wireless cards, e.g., certain WLAN cards or combo cards, may have more than two connectors 24.

Coaxial wires 16*a* and 16*b* are typically connected to wireless card 12 by manually press-fitting each connector 20 onto a corresponding connector 24 on card 12. Each manual wire-to-card connection is made separately, which may be manually intensive, particularly for cards 12 having three, four, or more connectors 20 to be connected to antenna wires.

SUMMARY

In accordance with the teachings of the present disclosure, disadvantages and problems associated with wireless antenna connections have been reduced.

In accordance with one embodiment of the present disclosure, a system for connecting a plurality of antenna cables to a wireless card includes a header connector and a connector plug. The header connector includes a header connector housing and multiple terminal pairs positioned in the header connector housing, each terminal pair including a first terminal and a second terminal. Each terminal includes a connection surface for securing the terminal to a substrate to provide a conductive path between the terminal and the substrate. The connector plug houses and positions multiple antenna cable end portions, each including an inner conductor and an outer conductor. The connector plug is configured to be mated with the header connector such that each cable end portion mates with one of the terminal pairs of the header connector, the inner conductor of the cable end portion mating with the first terminal of the terminal pair, and the outer conductor of the cable end portion mating with the second terminal of the terminal pair.

In accordance with another embodiment of the present disclosure, an information handling system includes a wireless card and a header connector coupled to the wireless card. The header connector includes a header connector housing, multiple terminal pairs positioned at least partially within the header connector housing, each terminal pair including a first terminal and a second terminal. Each terminal has a connection surface for securing the terminal to a substrate to provide a conductive path between the terminal and the substrate. The information handling system also includes one or more wireless antennas, multiple antenna cables connected to the one or more wireless antennas, and a connector plug configured to mate with the header connector of the wireless card. Each antenna cable has a cable end portion including a first conductor and a second conductor. The connector plug is houses and positions the multiple cable end portions. The connector plug is secured to the header connector such that each cable end portion mates with one of the terminal pairs of the header connector, the first conductor of the cable end portion mating with the first terminal of the terminal pair, and the second conductor of the cable end portion mating with the second terminal of the terminal pair.

In accordance with a further embodiment of the present disclosure, a wireless card for use in an information handling system includes a substrate and a header connector coupled to the substrate. The header connector includes a header connector housing, and multiple terminal pairs positioned at least partially within the header connector housing, each terminal pair including a first terminal and a second terminal. Each terminal has a connection surface for securing the terminal to the substrate to provide a conductive path between the terminal and the substrate. The header connector is configured to mate with a connector plug that houses multiple cable end portions, each cable end portion including an end portion of an antenna cable including an inner conductor and an outer conductor. The header connector is further configured to mate with the connector plug such that each cable end portion mates with one of the terminal pairs of the header connector, the inner conductor of the cable end portion mating with the first terminal of the terminal pair, and the outer conductor of the cable end portion mating with the second terminal of the terminal pair.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Preferred embodiments and their advantages are best understood by reference to FIGS. 2 through 6, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network storage device, or any other suitable device and may vary in size, shape, performance, functionality, and price. The information handling system may include memory, one or more processing resources such as a central processing unit (CPU) or hardware or software control logic. Additional components or the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

Figure 1:
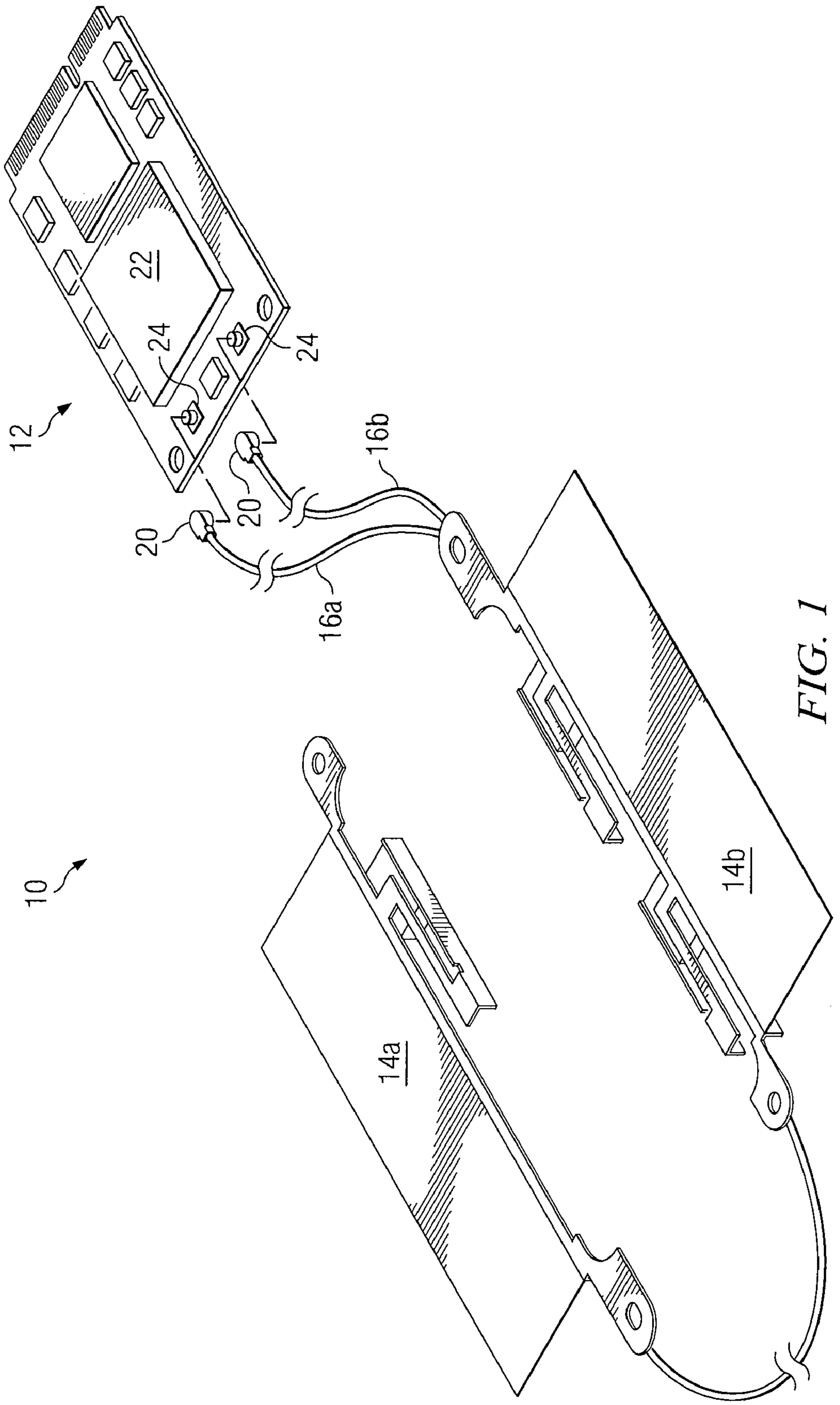
FIG. 1 (PRIOR ART)
FIG. 1 illustrates a system for connecting a wireless antenna apparatus to a wireless card using existing techniques.
Figure 2:
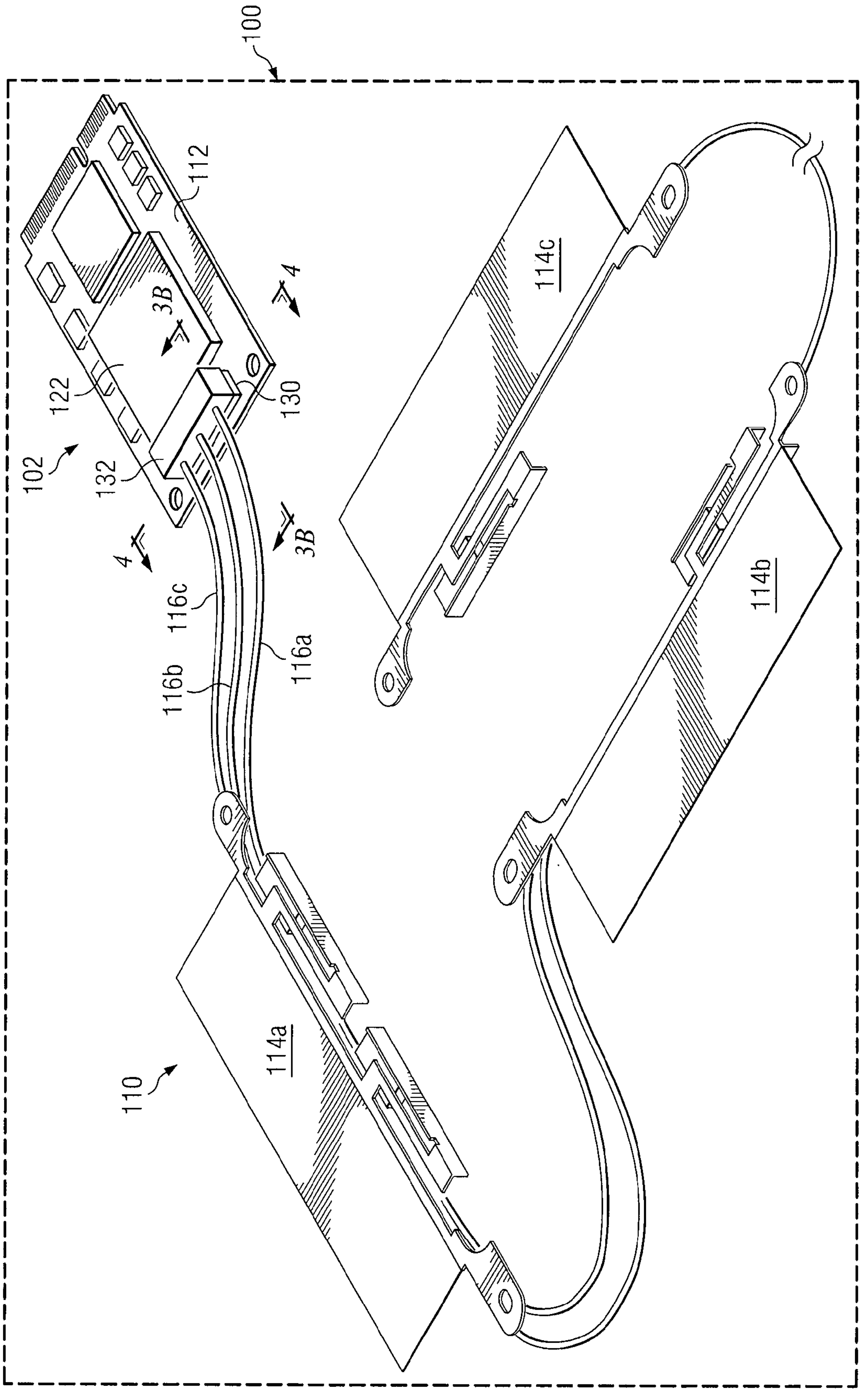
FIG. 2 illustrates an information handling system including an antenna connection system according to embodiments of the present disclosure.

FIG. 2 illustrates an information handling system 100 including an antenna connection system 102 according to embodiments of the present disclosure. Information handling system 100 may be any type of information handling system having wireless communications capabilities. In some embodiments, information handling system 100 is a laptop or notebook computer, a personal computer, a PDA, a consumer electronic device or office equipment (e.g., a cell phone, wireless printer, or HDTV), or other portable device.

Antenna connection system 102 comprises a system for connecting an antenna apparatus 110 to a wireless card 112. Antenna apparatus 110 includes multiple antenna surfaces 114 and cables 116 leading from surfaces 114, each cable terminating in a connector 120. In the illustrated example, antenna apparatus 110 includes three antennas including antenna surfaces 114*a*, 114*b*, and 114*c*, and cables 116*a*, 116*b*, and 116*c* leading from surfaces 114*a*, 114*b*, and 114*c*, respectively. However, antenna apparatus 110 may include any other number of antennas including any number of antenna surfaces 114 and/or cables 116. For example, antenna apparatus 110 may include 2, 3, 4, 5, or more antennas, each of which may include one or more cables 116.

Wireless card 112 generally includes various electronic components 122 (e.g., silicon chips, transistors, resistors, etc.). Card 112 may be any type of wireless card and may provide for wireless communications via any one or more different wireless communication protocols, e.g., wireless LAN (WLAN), wireless WAN (WWAN), Bluetooth, Ultra Wide-Band, etc. In some embodiments, card 112 may be a combo card that supports multiple wireless standards on a single substrate (e.g., a printed circuit board).

As discussed above, antenna connection system 102 functions to connect antenna apparatus 110 to wireless card 112. Connection system 102 includes a header connector 130 coupled to card 112 and a connector plug 132 coupled to an end portion of each of cables 116*a*, 116*b*, and 116*c*. As discussed in greater detail below, header connector 130 includes conductive terminals conductively coupled to various electronic components 122 on card 112. The terminals may be arranged in pairs, with each terminal pair corresponding to a particular cable 116*a*, 116*b*, or 116*c*, such that when connector plug 132 is mated with header connector 130, each cable 116*a*, 116*b*, or 116*c* is conductively coupled with a pair of terminals.

Connector plug 132 may be mated with header connector 130 (e.g., by pressing connector plug 132 onto header connector 130 manually or using an automated process) in order to conductively connect cables 116*a*, 116*b*, and 116*c* with electronic components 122 on card 112. As discussed in greater detail below, connector plug 132 may house and position an end portion of each cable 116*a*, 116*b*, and 116*c*. The end portions may be positioned and prepared such that when connector plug 132 is mated with header connector 130, each cable 116*a*, 116*b*, or 116*c* is conductively coupled with a corresponding pair of terminals in header connector 130.

In some embodiments, cables 116*a*, 116*b*, or 116*c* are coaxial cables having an inner conductor and an outer conductor. When connector plug 132 is mated with header connector 130, the inner conductor of each cable end portion mates with the first terminal of the corresponding terminal pair, and the outer conductor of each cable end portion mates with the second terminal of the terminal pair. In this manner, multiple cables 116 may be communicatively connected to card 112 using a single connection, which may, for example, reduce manual labor time and/or costs associated with connecting cables to wireless cards using conventional techniques.

Figure 3A:
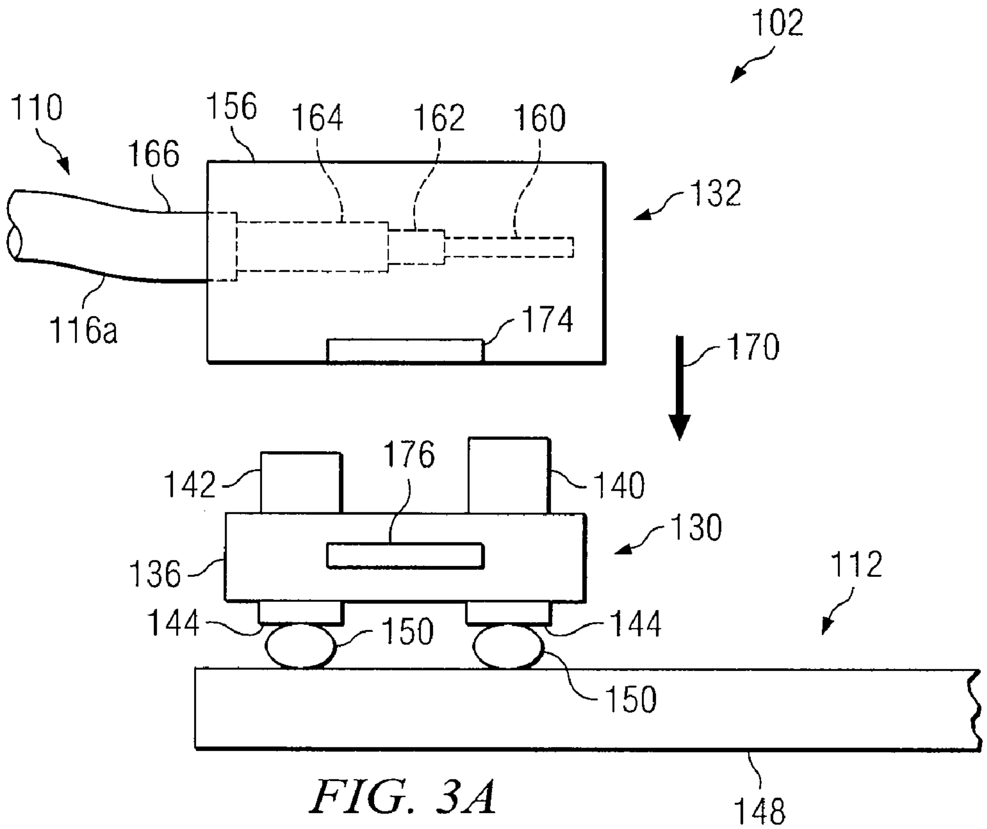
FIGS. 3A and 3B illustrate a partial side view of a connection system for connecting an antenna apparatus to a wireless card, according to one embodiment of the present disclosure.
Figure 3B:
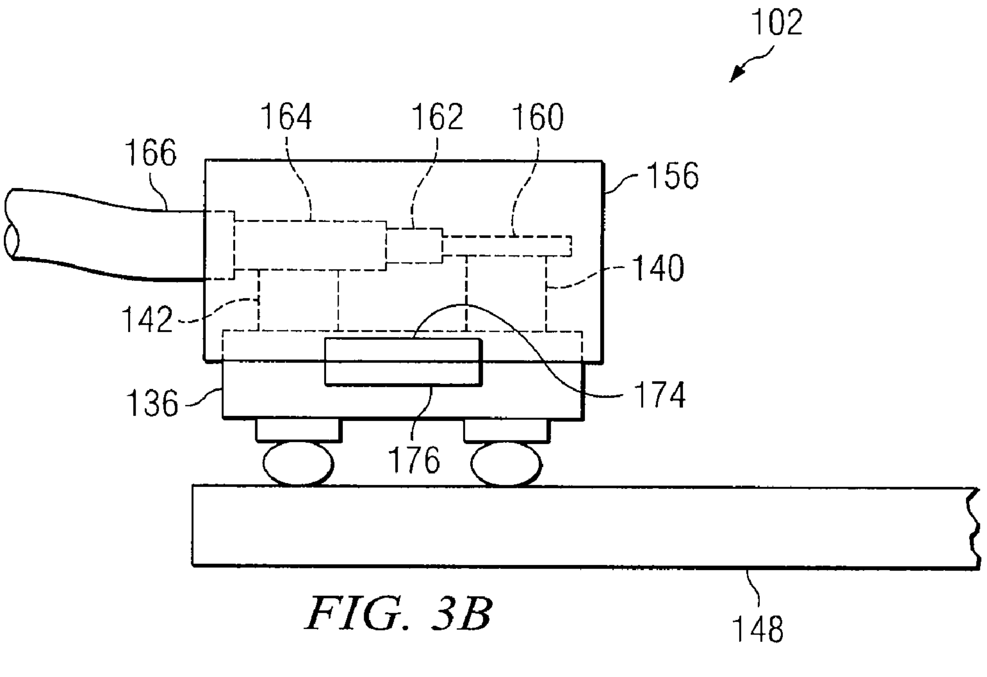

FIGS. 3A and 3B illustrate a partial side view of a connection system 102 for connecting an antenna apparatus 110 to a wireless card 112, according to one embodiment of the present disclosure. In particular, FIG. 3A illustrates connection system 102 before connector plug 132 is mated with header connector 130, and FIG. 3B illustrates connection system 102 after connector plug 132 is mated with header connector 130. FIG. 3B is a side view along line 3B-3B shown in FIG. 2.

Figure 5:
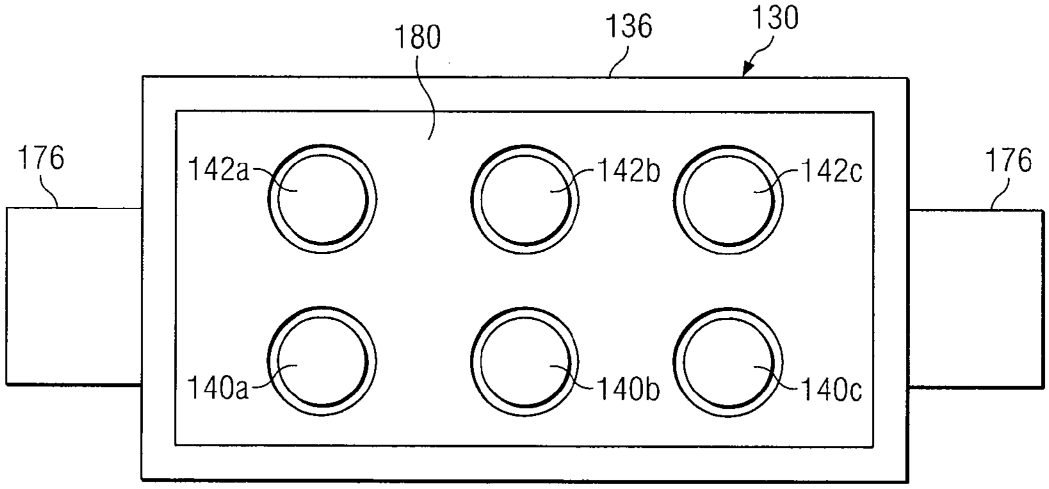
FIG. 5 illustrates a top view of a header connector of an antenna connection system taken along line 5-5 shown in FIG. 4, according to one embodiment of the present disclosure.

As shown in FIGS. 3A-3B, header connector 130 may include a housing 136 and a number of conductive terminals at least partially disposed within housing 136. The conductive terminals may be arranged in pairs, each pair of terminals corresponding to a particular cable 116. In this embodiment, conductive terminals 140 and 142 form a terminal pair corresponding to cable 116*a*. Additional terminal pairs corresponding to cables 116*b* and 116*c* may be disposed behind terminals 140 and 142 shown in this side view, as shown in FIG. 5 and discussed below.

Each conductive terminal 140, 142 may include a connection surface 144 configured to be conductively coupled to one or more conductive elements on a substrate 148 of wireless card 112. Substrate 148 may be any suitable substrate for a wireless card, e.g., a ceramic substrate or fiberglass printed circuit board (PCB)). For example, in the illustrated embodiment, a connection surface 144 of each conductive terminal 140, 142 projecting through an opening in the bottom of housing 136 may be soldered to card 112 to form a conductive path between each terminal 140, 142 and card 112. The solder connections are indicated generally by solder balls 150. In other embodiments, terminals 140, 142 may be coupled to card 112 in any other suitable manner, e.g., using adhesive, pins, clips, fasteners, or other connection devices. In some embodiments, in addition to securing terminals 140, 142 to card 112, heading connector housing 136 may also be secured to card 112 in any other suitable manner.

Connector plug 132 may house and position end portions of multiple cables 116. In this embodiment, connector plug 132 includes a housing 156 that houses and positions end portions of cables 116*a*, 116*b*, and 116*c*, although only cable 116*a* is visible in the side views of FIGS. 3A-3B. Cable 116*a* may be a coaxial cable having an inner conductor 160, an insulation layer 162, an outer conductor 164, and a jacket 166. In particular embodiments, inner conductor 160 may be a conductive center core, insulation layer 162 may be a dielectric insulator, outer conductor 164 may be a metallic shield, and a jacket 166 may be a insulating cover (e.g., formed of plastic, rubber, or other insulator).

In some embodiments, the end portion of each cable 116 may be prepared such that one or more internal layers (e.g., inner conductor 160 and/or outer conductor 164) of the cable 116 are exposed (e.g., as shown in FIGS. 3A-3B) before connecting connector plug 132 to header connector 130. This may facilitate the mating of inner conductor 160 and/or outer conductor 164 to terminals 140 and 142. In other embodiments, header connector 130 may include one or more cutting edges or surfaces configured to cut through particular layers of the cable 116 in order to expose and/or make contact with inner conductor 160 and/or outer conductor 164. For example, one or both of terminals 140 and 142 in each terminal pair may include a cutting edge or surface (e.g., a fork or guillotine configuration) to cut through insulating layer(s) of a cable 116 in order to mate with inner conductor 160 and/or outer conductor 164. In such embodiments, cables 116 may need less or no preparation before connecting connector plug 132 to header connector 130.

Cables 116 may be coupled to connector plug housing 156 in any suitable manner. For example, the end of each cable 116 may be inserted through an opening in housing 156 and coupled to housing 156 by adhesive, friction fit, fastener, or in any other suitable manner.

Connector plug 132 may be mated with header connector 130 in any suitable manner. For example, connector plug 132 may be manually pressed into contact with header connector 130 in the direction of arrow 170 shown in FIG. 3A, such that each cable 116 is conductively coupled with a corresponding pair of terminals 140, 142 in header connector 130. As another example, connector plug 132 may be coupled to header connector 130 using automated machines.

In addition, connector plug 132 may be secured to header connector 130, either removably or permanently, in any suitable manner. For example, in the illustrated embodiment, one or more mating ears 174 coupled to plug connector housing 156 may be secured to one or more mating ears 176 coupled to heading connector housing 136. Mating ears 174 may be secured to mating ears 176 in any suitable manner. For example, a protrusion on one of ears 174, 176 may be inserted into an opening in the other ear 176, 174 with a friction fit. As other examples, ears 174 and 176 may be secured together using soldering, adhesive, pins, clips, fasteners, or other connection devices.

Figure 4:
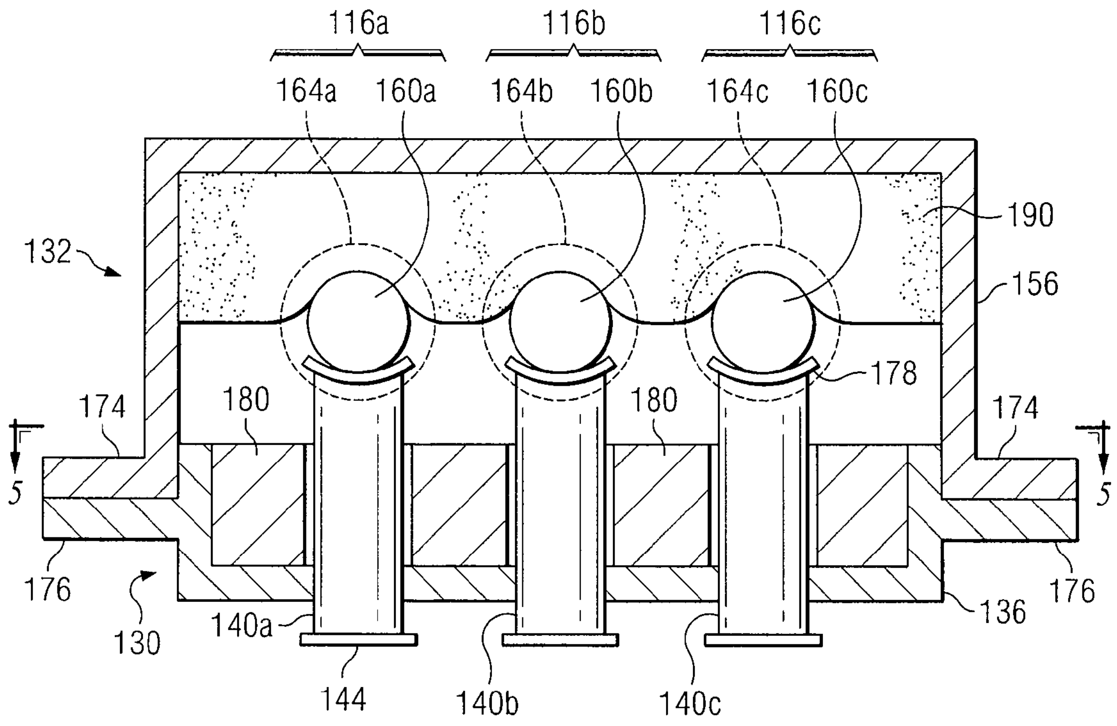
FIG. 4 illustrates a cross-sectional view of an antenna connection system taken along line 4-4 shown in FIG. 2, according to one embodiment of the present disclosure.

FIG. 4 illustrates a cross-sectional view of connection system 102 taken along line 4-4 shown in FIG. 2, according to one embodiment of the present disclosure. The cross-section cuts through terminals 140*a*, 140*b*, and 140*c*, which mate with inner conductors 160*a*, 160*b*, and 160*c* of cables 116*a*, 116*b*, and 116*c*, respectively. Outer conductors 164*a*, 164*b*, and 164*c* of cables 116*a*, 116*b*, and 116*c* are indicated by dashed lines, and such outer conductors mate with three terminals 142.

Terminals 140 and/or 142 may have any suitable shape, size, and configuration. For example, terminals 140 and/or 142 may have an elliptical or round cross-section (i.e., cylindrical terminals), a square or rectangular cross-section, or any other suitable cross-section. In some embodiments, a top portion of each terminal 140, 142 may be flat. In other embodiments, a top portion of each terminal 140, 142 may be curved, flared, or otherwise shaped in order to facilitate the mating of cables 116 with terminals 140, 142. For example, in the embodiment shown in FIG. 4, each terminal 140, 142 includes a flared top portion 178 that may guide the relevant portion of cable 116 into contact with that terminal 140, 142 and/or help maintain a secure contact between the cable 116 and terminal 140, 142. The top portion 178 may be a shaped end portion of the terminal 140, 142, or may be a separate conductive element affixed to the terminal 140, 142.

In still other embodiments, one or both of terminals 140 and 142 in each terminal pair may include a cutting edge or surface to cut through insulating layer(s) of a cable 116 in order to mate with inner conductor 160 and/or outer conductor 164, e.g., such that cables 116 need not be stripped before connecting connector plug 132 to heading connector 130.

Terminals 140 and 142 may be formed from any suitable conductive material. For example, in particular embodiments, terminals 140 and 142 are formed from beryllium copper or phosphorus bronze copper (PBC). In addition, terminals 140 and/or 142 may be plated, e.g., nickel/gold plating.

Connection surface 144 on each terminal 140, 142 may also be formed from any suitable conductive material, which may be the same material or a different material than the terminal 140, 142. In some embodiments, connection surface 144 is a flat copper surface.

In some embodiments, isolation material (e.g., a bushing) 180 may be disposed between the various terminals 140 and 142 and/or between terminals 140, 142 and heading connector housing 136. Isolation material 180 may be formed from any material suitable for electrically isolating terminals 140, 142 from each other and/or from heading connector housing 136, and/or for providing increased RF isolation for terminals 140, 142. In some embodiment, isolation material 180 may be a dispensed liquid or a preformed material cut out of stock. For example, isolation material 180 may comprise modified PTFE or TEFLON.

In some embodiments, an shielding material 190 may be disposed in plug connector housing 156. Shielding material 190 may be generally operable to provide RF or EMS shielding and noise reduction between cables 116 and outside elements. For example, shielding material 190 may comprise silicone rubber, room-temperature vulcanizing (RTV) silicone, etc. Shielding material 190 may be disposed above and/or around the end portion of cables 116 within housing 156. In some embodiments, shielding material 190 is disposed generally around the end portion of cables 116, but includes openings that allow for the connection of inner conductors 160 and/or outer conductors 164 to terminals 140 and/or 142. Shielding material 190 may be disposed in any suitable manner, e.g., as a dispensed liquid or a preformed material cut out of stock. In some embodiments, shielding material 190 may help to maintain or secure the contact between conductors 160, 164 and terminals 140, 142.

Plug connector housing 156 and heading connector housing 136 may be formed from any suitable materials. For example, plug connector housing 156 is formed from beryllium copper or phosphorus bronze copper (PBC). In addition, plug connector housing 156 may be plated, e.g., using nickel/gold, silver, or tin plating. Heading connector housing 136 may be formed, for example, from a castable magnetically loaded epoxide material.

FIG. 5 illustrates a top view of header connector 130 taken along line 5-5 shown in FIG. 4, according to one embodiment of the present disclosure. As shown in FIG. 5, header connector 130 includes three pairs of terminals: 140*a*/142*a*, 140*b*/142*b*, and 140*c*/142*c*, which are mated with cables 116*a*, 116*b*, and 116*c*, respectively. In this embodiment, isolation material 18 extends around and between terminals 140, 142.

Although the illustrated example is configured to connecting three cables 116 to a wireless card 112, it should be understood that connection system 102 may be configured for connecting any suitable number of cables to a wireless card. Thus, header connector 130 may include any suitable number of terminal pairs 140, 142 (e.g., 2, 3, 4, 5, 6, or more terminal pairs), and plug connector 132 may be configured to house and locate any suitable number of cables 116 (e.g., 2, 3, 4, 5, or more cables).

Figure 6:
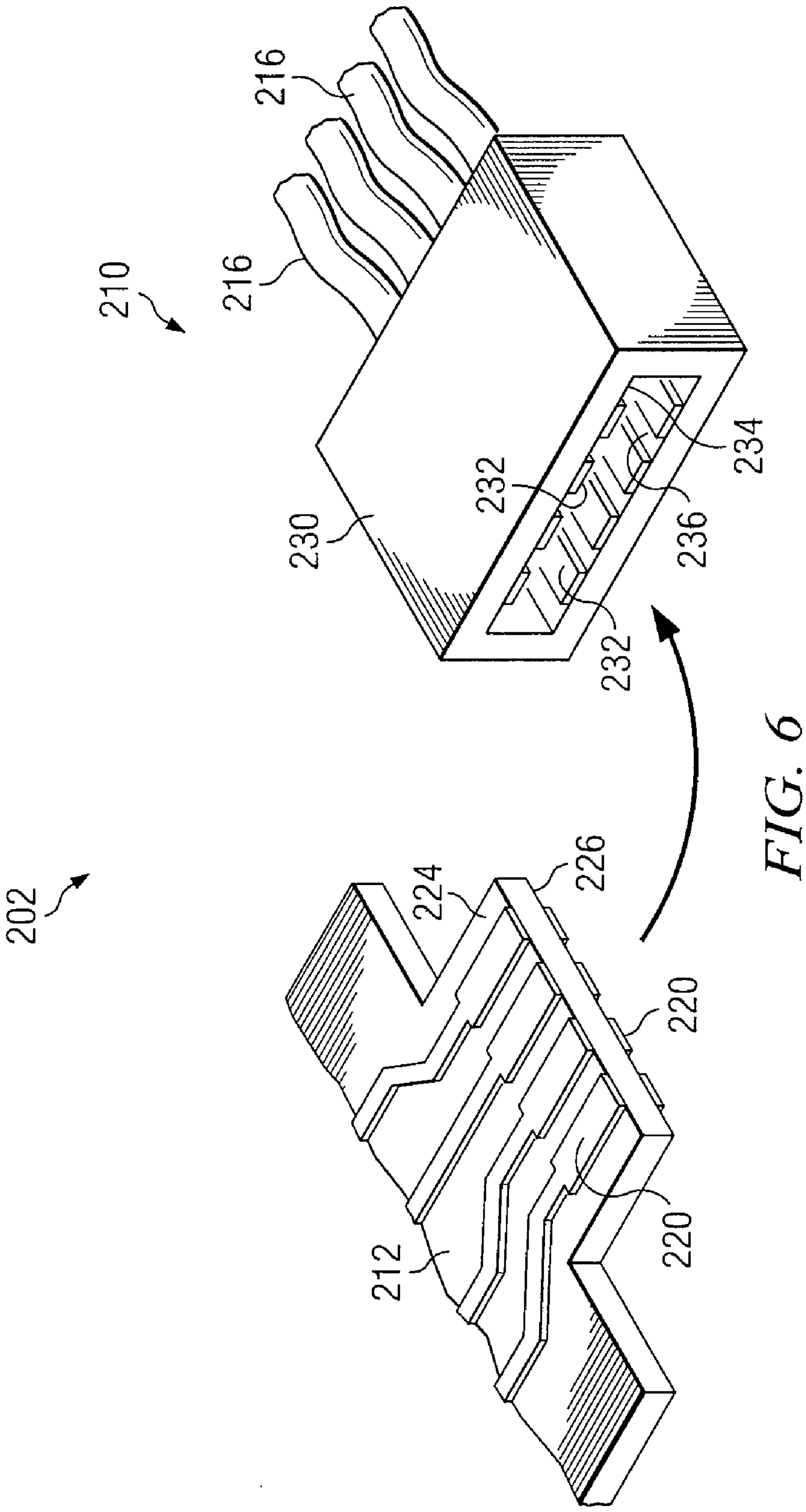
FIG. 6 illustrates a connection system for connecting an antenna apparatus to a wireless card using a card edge connection, according to another embodiment of the present disclosure.

FIG. 6 illustrates another connection system 202 for connecting an antenna apparatus 210 to a wireless card 212 using a card edge connection, according to another embodiment of the present disclosure. In this embodiment, wireless card 212 includes a male card edge connector portion 220 including a plurality of conductive contacts 222. Conductive contacts 222 may be coupled to various electronics on card 212 via any suitable conductive traces or paths. As shown in FIG. 6, conductive contacts 222 may be formed on each side 224 and 226 of male connector portion 220. In other embodiments, conductive contacts 222 may be formed only on a single side of male connector portion 220. Conductive contacts 222 may be formed from any suitable conductive material, e.g., copper or gold.

Antenna apparatus 210 includes a female card edge connector portion 230 configured to receive male connector portion 220 in a plug-type connection. Female connector portion 230 includes a plurality of conductive contacts 232 coupled to antenna cables 216 and arranged such that when male connector portion 220 is plugged into female connector portion 230, conductive contacts 232 mate with contacts 222 in order to conductively connect cables 216 with wireless card 212. As shown in FIG. 6, conductive contacts 232 may be formed on each side 234 and 236 of female connector portion 230. In other embodiments, conductive contacts 232 may be formed only on a single side of male connector portion 230. Conductive contacts 232 may be formed from any suitable conductive material, e.g., copper or gold.

Conductive contacts 232 may be coupled to antenna cables 216 in any suitable manner. Any suitable number of contacts 232 may correspond to each individual cable 216. For example, each cable 216 may be coupled to a pair of contacts 232, one on each side 234, 236 of connector portion 230 or both on the same side 234 or 236 of connector portion 230. As another example, each cable 216 may be coupled to four contacts 232, two on each side 234, 236 of connector portion 230 or all four on the same side 234 or 236 of connector portion 230.

Although the present disclosure has been described in detail, it should be understood that various changes, substitutions, and alterations can be made hereto without departing from the spirit and the scope of the invention as defined by the appended claims.

What is claimed is:

1. A system for connecting a plurality of antenna cables to a wireless card, comprising:
- a header connector including:
  - a header connector housing;
  - multiple terminal pairs positioned at least partially within the header connector housing, each terminal pair including a first terminal and a second terminal; and
  - a connection surface for each terminal for securing the terminal to a substrate to provide a conductive path between the terminal and the substrate; and
- a connector plug configured to house and position multiple cable end portions, each cable end portion including an end portion of an antenna cable including an inner conductor and an outer conductor;
- wherein the connector plug is configured to mate with the header connector such that each cable end portion mates with one of the terminal pairs of the header connector, the inner conductor of the cable end portion mating with the first terminal of the terminal pair, and the outer conductor of the cable end portion mating with the second terminal of the terminal pair.

2. A system according to claim 1, wherein:
- the header connector includes at least three terminal pairs; and
- the connector plug houses and positions at least three cable end portions of at least three antenna cables.

3. A system according to claim 1, wherein the header connector further includes an isolating bushing to electrically isolate the terminals from each other and from the header connector housing.

4. A system according to claim 1, wherein at least one of the terminals includes a flared end for receiving a cable end portion.

5. A system according to claim 1, wherein the terminal pairs are arranged in an array, and each of the terminals extends in a direction perpendicular to the substrate.

6. A system according to claim 1, the connector plug further including RF shielding material to isolate the antenna cables from each other.

7. A system according to claim 1, wherein the connection surface for each terminal is configured for soldering the terminal to the substrate.

8. An information handling system, comprising:

a wireless card;

a header connector coupled to the wireless card, the header connector including:

a header connector housing;

multiple terminal pairs positioned at least partially within the header connector housing, each terminal pair including a first terminal and a second terminal; and a connection surface for each terminal for securing the terminal to a substrate to provide a conductive path between the terminal and the substrate; and one or more wireless antennas;

multiple antenna cables connected to the one or more wireless antennas, each antenna cable having a cable end portion, each cable end portion including a first conductor and a second conductor;

a connector plug configured to house and position the multiple cable end portions, the connector plug being secured to the header connector such that each cable end portion mates with one of the terminal pairs of the header connector, the first conductor of the cable end portion mating with the first terminal of the terminal pair, and the second conductor of the cable end portion mating with the second terminal of the terminal pair.

9. An information handling system according to claim 8, wherein each terminal is soldered to the substrate at the connection surface of the terminal.

10. An information handling system according to claim 8, wherein:

the header connector includes at least three terminal pairs; and the connector plug houses and positions at least three cable end portions of at least three cables.

11. An information handling system according to claim 8, wherein the header connector further includes an isolating bushing to electrically isolate the terminals from each other and from the header connector housing.

12. An information handling system according to claim 8, wherein at least one of the terminals includes a flared end for receiving a cable end portion.

13. A wireless card for use in an information handling system, the wireless card comprising:

a substrate;

a header connector coupled to the substrate, the header connector including:

a header connector housing;

multiple terminal pairs positioned at least partially within the header connector housing, each terminal pair including a first terminal and a second terminal; and a connection surface for each terminal for securing the terminal to the substrate to provide a conductive path between the terminal and the substrate;

wherein the header connector is configured to mate with a connector plug that houses multiple cable end portions, each cable end portion including an end portion of an antenna cable including an inner conductor and an outer conductor;

wherein the header connector is configured to mate with the connector plug such that each cable end portion mates with one of the terminal pairs of the header connector, the inner conductor of the cable end portion mating with the first terminal of the terminal pair, and the outer conductor of the cable end portion mating with the second terminal of the terminal pair.

14. A wireless card according to claim 13, wherein each terminal is soldered to the substrate at the connection surface of the terminal.

15. A wireless card according to claim 13, wherein at least one of the terminals includes a flared end for receiving a cable end portion.

16. A wireless card according to claim 13, wherein:

the header connector includes at least three terminal pairs; and the connector plug that houses multiple cable end portions comprises a connector plug that houses at least three cable end portions of at least three antenna cables.

17. A wireless card according to claim 13, wherein the header connector further includes an isolating bushing to electrically isolate the terminals from each other and from the header connector housing.

* * * * *